US010127951B2

(12) United States Patent
Singh (10) Patent No.: US 10,127,951 B2
(45) Date of Patent: Nov. 13, 2018

(54) MEMORY DEVICE WITH REDUCED-RESISTANCE INTERCONNECT

(71) Applicant: Taiwan Semiconductor Manufacturing Co., Ltd., Hsin-Chu (TW)

(72) Inventor: Sahil Preet Singh, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/172,555

(22) Filed: Jun. 3, 2016

(65) Prior Publication Data

US 2017/0133063 A1 May 11, 2017

Related U.S. Application Data

(60) Provisional application No. 62/252,858, filed on Nov. 9, 2015.

(51) Int. Cl.
*G11C 5/06* (2006.01)

(52) U.S. Cl.
CPC .................. *G11C 5/063* (2013.01)

(58) Field of Classification Search
CPC ....................................... G11C 5/063
USPC ........................................... 365/63
See application file for complete search history.

(56) References Cited

U.S. PATENT DOCUMENTS

| | | | | |
|---|---|---|---|---|
| 5,859,807 A * | 1/1999 | Otori | ............... | G11C 7/065 365/189.11 |
| 5,949,699 A * | 9/1999 | Saruwatari | ............. | G11C 5/063 365/51 |
| 2010/0054023 A1* | 3/2010 | Park | ............... | G11C 5/147 365/149 |
| 2016/0379695 A1* | 12/2016 | Kulkarni | ............. | G11C 11/1659 365/148 |

* cited by examiner

*Primary Examiner* — Anthan Tran
(74) *Attorney, Agent, or Firm* — Eschweiler & Potashnik, LLC (57) ABSTRACT

In some embodiments, a memory device comprises first and second conductive lines extending generally in parallel with one another over a row of memory cells. The first and second conductive lines are disposed in a first interconnect layer and are coupled to memory cells of the row. A first plurality of conductive line segments are disposed in a second interconnect layer disposed over the first interconnect layer. Conductive line segments of the first plurality of conductive line segments are coupled to different locations on the first conductive line and are coupled in parallel with the first conductive line. A second plurality of conductive line segments are disposed over the second conductive line. Conductive line segments of the second plurality of conductive line segments are coupled to different locations on the second conductive line and are coupled in parallel with the second conductive line.

20 Claims, 9 Drawing Sheets

MEMORY DEVICE WITH REDUCED-RESISTANCE INTERCONNECT

REFERENCE TO RELATED APPLICATION

This Application claims priority to U.S. Provisional Application No. 62/252,858 filed on Nov. 9, 2015, the contents of which is hereby incorporated by reference in its entirety.

BACKGROUND

Semiconductor memory is an electronic data storage device implemented on a semiconductor-based integrated circuit, and generally has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
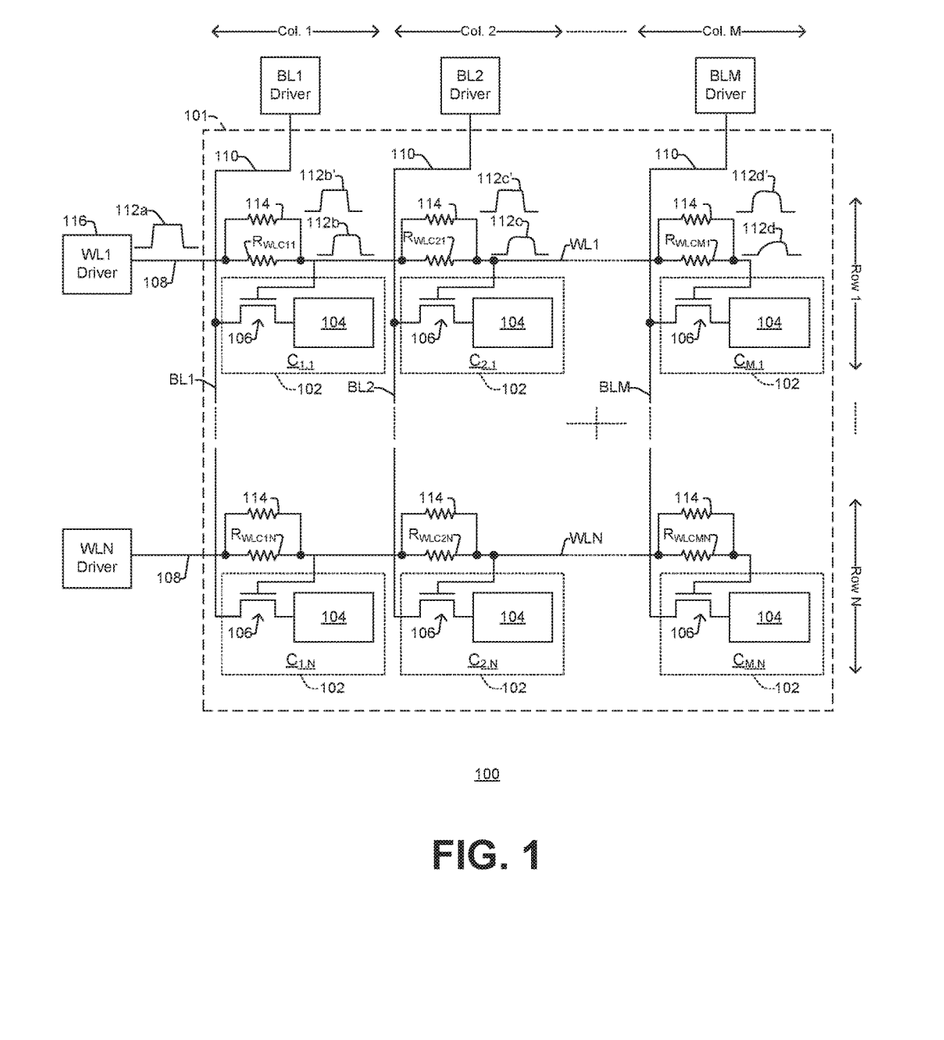
FIG. 1 illustrates a block diagram of a memory device according to some embodiments of the present disclosure.

Memory devices typically include an array of memory cells arranged in rows and columns. FIG. 1 shows an example of one such memory device 100 that includes an array 101 in which memory cells 102 are arranged in a series of M columns and N rows, where M and N can be any integers and can be the same or different from one another. For clarity, the individual memory cells 102 are labeled as $C_{COLUMN-ROW}$ in FIG. 1. In FIG. 1's example, the memory cells 102 are single-ended memory cells each having a single port, but as will be appreciated in more detail herein, in other embodiments memory cells can be differential rather than single-ended and/or can have multiple ports rather than a single port.

Each memory cell 102 includes a data storage element 104 that is accessible through an access transistor 106 or other access device, such as a diode for example. Along each row, one or more wordlines 108 are coupled to gates of the access transistors 106 of that row; while along each column, one or more bitlines 110 are coupled to source/drains regions of the access transistors 106 along that column. To write data to a row of memory cells, the wordline 108 of the row is asserted to enable the access transistors 106 of the row, and then the bitlines 110 are biased to program data states to the individual data storage elements 104 of the accessed row.

While data is being written a row, the wordlines 108 of the other rows are de-asserted such that the access transistors 106 of the other rows remain off and the biases applied to the bitlines 110 do not alter the states of the non-accessed rows. For example, to write to the memory cells of Row 1, WL1 driver 116 asserts wordline WL1 of Row 1, thereby coupling the data storage elements 104 of cells $C_{1,1}$ through $C_{M,1}$ to bitlines BL1 through BLM, respectively. While WL1 driver 116 is asserting WL1, the bitlines BL1 through BLM are individually biased to correspond to individual data values to be written to cells $C_{1,1}$ through $C_{M,1}$, respectively. This writes the individual data values to the accessed memory cells $C_{1,1}$ through $C_{M,1}$, such that after WL1 is de-asserted the written data values remain stored in the data storage elements 104 of memory cells $C_{1,1}$ through $C_{M,1}$.

The wordlines 108 and bitlines 110 are formed as conductive lines in an interconnect structure of the memory device 100. Though these conductive lines may be thought of as wires with negligible resistance, in fact, each conductive line, like any wire, has a small resistance which is proportional to its length. Thus, for example, the wordlines 108 are shown with a series of wordline resistances over their length—for example, WL1 is shown as including unit resistances $R_{WLC11}$, $R_{WLC21}$, $R_{WLCM1}$. As feature sizes shrink for successive generations of technology, the wordlines 108 and bitlines 110 are becoming thinner, which tends to increase their resistances. This can lead to resistance-induced performance degradation for wordlines 108 and/or bitlines 110. For example, when WL1 driver 116 provides a wordline pulse signal at a near end of WL1 in FIG. 1 (see wordline pulse 112a), the shape of the wordline pulse signal may degrade as the wordline pulse signal propagates down the length of WL1 (see wordline pulses 112b-112d). The same can be true of bitlines.

To combat this signal degradation, in some embodiments, a number of conductive line segments 114 are formed over each of the wordlines 108 and are coupled to different locations on the wordlines 108. The conductive line segments 114 are coupled in parallel with the wordlines 108. The conductive line segments 114 have small resistances (which can be similar to that of the wordlines 108 and/or bitlines 110 on a unit length basis), but still effectively reduce the resistance seen by a wordline signal propagating down the length of a wordline, which limits signal degradation. For example, in some embodiments, each wordline 108 can be a continuous metal2 line that extends in unbroken fashion over the entire wordline length, and the conductive line segments 114 can correspond to separate metal4 segments which extend over each memory cell 102 and which extend generally in parallel with the metal2 wordline 108. The metal4 conductive line segments 114 are coupled to different locations on the metal2 wordline 108, such that the metal4 conductive segments 114 establish a series of "bridges" over the metal2 wordline 108. Because the metal4 conductive line segments 114 are arranged in parallel with the metal2 wordline 108, the resultant resistance of the metal2 wordline 108 and metal4 conductive line segments 114 in parallel is less than the resistance of the metal2 wordline 108 alone. Thus, the resultant wordline signal exhibits reduced signal degradation (see improved wordline signals 112b'-112d'), compared to if only a single metal2 wordline were used. The wordlines 108 being in metal2 and conductive line segments 114 being in metal4 is just an example for clarity, and does not any way limit the scope of the present disclosure. The wordlines 108 can also be formed in other layers, for example, polysilicon, metal1, metal3 metal4, metal5, etc., and the conductive line segments can also be formed in another layer or in multiple layers, for example, polysilicon, metal1, metal2, metal3, metal5, etc.

Figure 2:
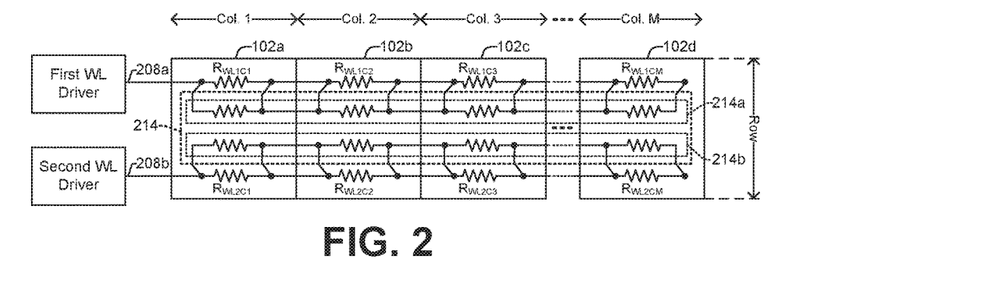
FIG. 2 illustrates a schematic diagram of a row of memory cells having first and second wordlines extending generally in parallel over the row in accordance with some embodiments.

In some memory devices, such as in dual-port memory devices or in memory devices utilizing interleaved wordlines (examples for both of which are described in more detail herein), rather than a single wordline extending over a row of memory cells as illustrated in FIG. 1, two or more wordlines both extend over a single row of memory cells. FIG. 2 illustrates a row of memory cells depicting one such example. Though FIG. 2 shows only a single row of memory cells, it will be appreciated that the row illustrated in FIG. 2 may be part of a larger array with multiple rows and with two or more wordlines extending over each row. The concept is also applicable to two or more bitlines extending along a single column of memory cells in other embodiments, and thus FIG. 2 is described below with regards to first and second conductive lines 208a, 208b.

In FIG. 2, the first and second conductive lines 208a, 208b are coupled to the memory cells 102a, 102b, 102c, 102d of the row. The first and second conductive lines 208a, 208b, which can correspond to separately assertable wordlines or bitlines for example, extend generally in parallel with one another over a single row of memory cells. Conductive line segments 214 are disposed over the first and second conductive lines 208a, 208b. A first subset of conductive line segments 214a are coupled to different locations on the first conductive line 208a and are electrically coupled in parallel with the first conductive line 208a. A second subset of conductive line segments 214b are coupled to different locations on the second conductive line 208b and are electrically coupled in parallel with the second conductive line 208b. By being arranged in parallel with the first and second conductive lines 208a, 208b, the conductive line segments 214a, 214b reduce the effective electrical resistance seen by signal pulses traveling down the conductive lines 208a, 208b, which can limit signal degradation of wordline and/or bitline signals.

Figure 3:
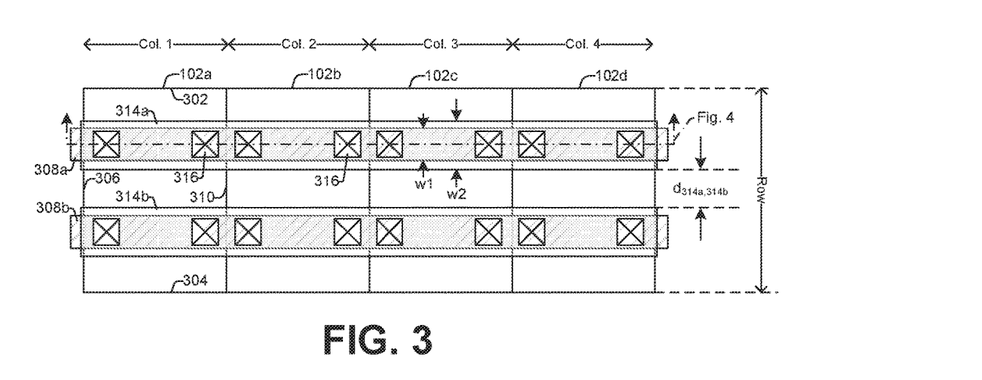
FIG. 3 illustrates a layout view of a row of memory cells in accordance with some embodiments.

FIG. 3 shows a layout view of a row of memory cells, which is consistent with some embodiments of FIG. 2. In FIG. 3, each memory cell has an outer perimeter that circumscribes the contents of the memory cell, which typically includes a data storage element and one or more access transistors. For example, a first memory cell 102a includes an upper edge 302, lower edge 304, left edge 306, and right edge 310. Though FIG. 3 illustrates the perimeter of each memory cell 102a, 102b, 102c, 102d as a rectangle whose height is larger than its width, in other embodiments, the memory cells may take the form of a rectangle whose width is larger than its height, or may take the form of another polygon with other than four edges. In some embodiments, the memory cells 102a, 102b, 102c, 102d are tiled together so their edges contact one another, thereby achieving a dense layout for an array. The first and second conductive lines 308a, 308b, which may be formed in a first interconnect layer such as a metal2 layer for example, extend generally in parallel with one another in a first direction over the row of memory cells. Conductive line segments 314a, 314b are arranged in parallel with one another and are disposed in a second interconnect layer, such as a metal4 layer for example, in the first direction over the row of memory cells. The conductive line segments 314a, 314b are electrically in parallel with the first and second conductive lines 308a, 308b, respectively. By being arranged in parallel with the first and second conductive lines 308a, 308b, the conductive line segments 314a, 314b reduce the effective electrical resistance seen by signal pulses traveling down the conductive lines 308a, 208b, which can limit signal degradation of wordline and/or bitline signals.

Figure 4:
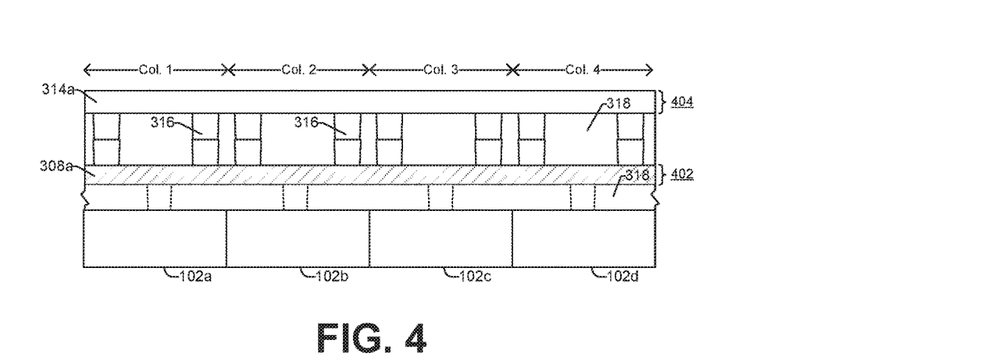
FIG. 4 illustrates some embodiments of a cross-sectional view of the row of memory cells in accordance with FIG. 3.

Referring briefly to FIG. 4, which shows some embodiments of a cross-sectional view of FIG. 3's layout, the first and second conductive lines 308a, 308b are formed in a first interconnect layer 402, and the conductive line segments 314a, 314b are formed in a second interconnect layer 404 that resides over the first interconnect layer 402. The first and second conductive lines 308a, 308b and conductive line segments 314a, 314b are surrounded by a dielectric structure 318, such as made of low-k dielectric material or silicon dioxide, for example. Vias 316 extend through the dielectric structure 318 to couple the first and second conductive lines 308a, 308b in parallel with the conductive line segments 314a, 314b, respectively. Only two vias are labeled for ease of viewing. In some embodiments, the first interconnect layer 402 is a metal2 layer immediately over a lowermost metal1 layer (not shown), and the second interconnect layer 404 is a metal4 layer with an intervening metal3 layer (not shown) arranged between the metal2 layer and metal4 layer.

Referring back to FIG. 3, in some embodiments, the first and second conductive lines 308a, 308b have a first minimum line width, w1, and the conductive line segments 314a, 314b have a second minimum line width, w2, which is greater than the first minimum line width, w1. This increased line width for metal lines which are higher in the interconnect structure can help to reduce current crowding issues for the chip as a whole, as the higher metal lines may carry larger current-, voltage-, and/or power-levels than lower metal lines in some situations.

Though it may be advantageous to have the conductive line segments 314a, 314b with a larger minimum line width than the first and second conductive lines 308a, 308b, in some embodiments it is also advantageous to "push" the first and second conductive lines 308a, 308b closer together to increase the density of the array portion of the memory device. FIGS. 5-10, which are described below, illustrate some embodiments that allow denser memory storage by "pushing" the first and second conductive lines closer together.

Figure 5:
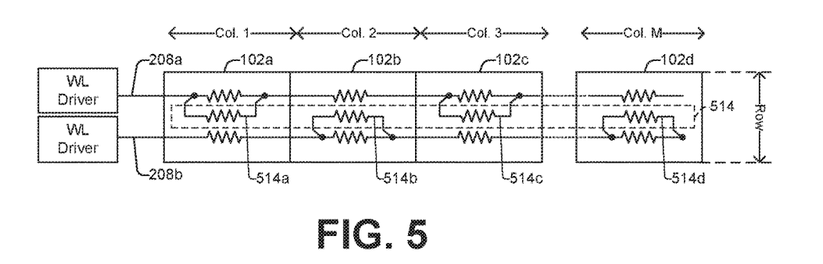
FIG. 5 illustrates a schematic diagram of a row of memory cells having first and second wordlines extending generally in parallel over the row in accordance with some embodiments.

In FIG. 5, the conductive line segments 514 alternate between being coupled to the first conductive line 208a and being coupled to the second conductive line 208b. Thus, a first subset of conductive line segments (514a, 514c) are coupled to a first subset of memory cells (102a, 102c, respectively) along the row through the first conductive line 208a, and a second subset of conductive line segments (514b, 514d) are coupled to a second subset of memory cells (102b, 102d, respectively) along the row through the second conductive line 208b. In some embodiments, there is a one-to-one correspondence between a number of memory cells in the row and a sum of the first subset of conductive line segments plus the second subset of conductive line segments over the row. FIG. 5's embodiment again reduces resistance for interconnect compared to some traditional approaches, and can also increase the density of a memory array by "squeezing" rows of memory cells closer together.

Figure 6:
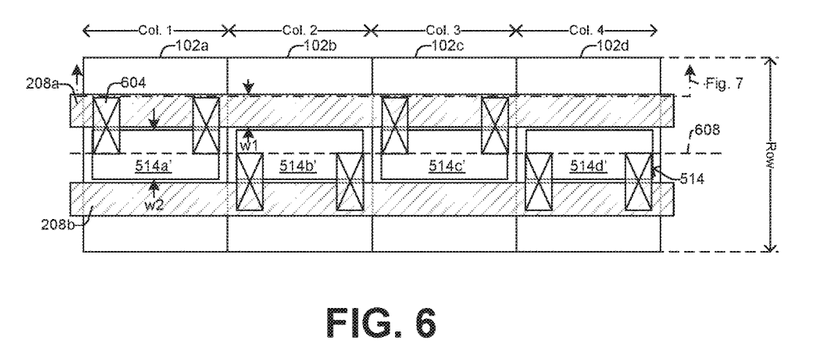
FIG. 6 illustrates a layout view of a row of memory cells in accordance with some embodiments.

FIG. 6 shows some embodiments of a layout corresponding to FIG. 5's schematic. In FIG. 6, a number of conductive line segments 514 (e.g., 514a', 514b', 514c', and 514d') are co-linear and extend over a centerline 608 between the first and second conductive lines 208a, 208b. Vias 604 or other coupling structures electrically couple the conductive line segments 514 to different locations on the first and second conductive lines 208a, 208b. The layout of FIG. 6 is advantageous in some regards, as the arrangement of the conductive line segments 514 is symmetric with regards to the first and second conductive lines 208a, 208b, and provides good electrical characteristics in terms of capacitance, matching, etc. Further, FIG. 6's embodiment strikes a delicate balance in that conductive line segments 514a'-514d' still have a minimum width w2 that is greater than a first width w1 of the first and second conductive lines 208a, 208b, but because only a single line of conductive line segments 514 extend over the row of memory cells, a denser layout is achieved for adjacent rows.

In some embodiments, the first and second conductive lines 208a, 208b and/or conductive line segments 514 can use "coloring" techniques to achieve further improvements in layout density. In "coloring" techniques, multiple masks are used for a single layer on the integrated circuit, such that the resultant single layer can have features that are more closely spaced than can be achieved with a single exposure photolithography step. For example, in some embodiments the first and second conductive lines 208a, 208b can be metal 1 lines of different colors and/or the conductive line segments 514 can be metal 3 lines of different colors.

Thus, the first conductive line 208a can be a metal 1 line of a first color, and the second conductive line 208b can be a metal 1 line of a second color. Consequently, even if the lithography system used to form the first and second conductive lines 208a, 208b is capable of achieving some predetermined minimum resolution for a single mask step (such as nearest edges of neighboring metal 1 lines which are formed by a single mask being separated by 20 nm); lines of different colors can have edges that are separated by less than the predetermined minimum resolution (such as nearest edges of metal 1 lines of different colors being separated by only 10 nm). In this way, the first lines 208a of neighboring memory cells can be formed using a first mask (e.g., red color) so the resultant first lines 208a have a pitch corresponding to the minimum resolution (e.g., 20 nm). The second lines 208b of neighboring memory cells can be formed using a second mask (e.g., green color) so the resultant second lines 208b also have a pitch corresponding to the minimum resolution (e.g., 20 nm). Because the first lines 208a are interspersed with the second lines 208b on a single metal layer, the resultant spacing between an edge of the first line 208a and a nearest edge of the second line 208b can be less than the minimum resolution achievable by a single mask step. In some embodiments, consecutive conductive segments are formed of alternating colors—for example, conductive segments 514a and 514c can have a first color (e.g., red or green), and conductive segments 514b, 514d can have a second color that is different from the first color (e.g., green or red). In other embodiments, conductive segments 514a and 514b have a first color (e.g., red or green), and conductive segments 514c and 514d have a second color that differs from the first color (e.g., green or red). In still other embodiments, the conductive segments 514 can all share a single color, which reduces mask costs and simplifies manufacturing, but which also results in a lower feature density than if multiple colors were used. Coloring could also be used for other embodiments in a similar manner.

Figure 7:
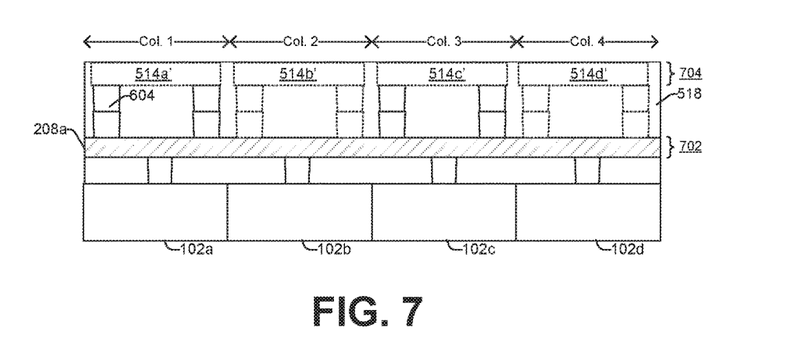
FIG. 7 illustrates some embodiments of a cross-sectional view of the row of memory cells in accordance with FIG. 6.

FIG. 7 shows some embodiments of a cross-sectional view of FIG. 6's layout, where the first and second conductive lines 208a, 208b are formed in a first interconnect layer 702, and the conductive line segments 514a'-514d' are formed in a second interconnect layer 704 that resides over the first interconnect layer 702. The first and second conductive lines 208a, 208b and conductive line segments 514a', 514b' are surrounded by a dielectric structure 518, such as made of low-k dielectric material or silicon dioxide, for example. Vias 604 extend through the dielectric structure 518 to couple the first conductive line 208a in parallel with the conductive line segments 514a', 514c'; and to couple the second conductive line 208b in parallel with conductive line segment 514b', 514d'.

Figure 8:
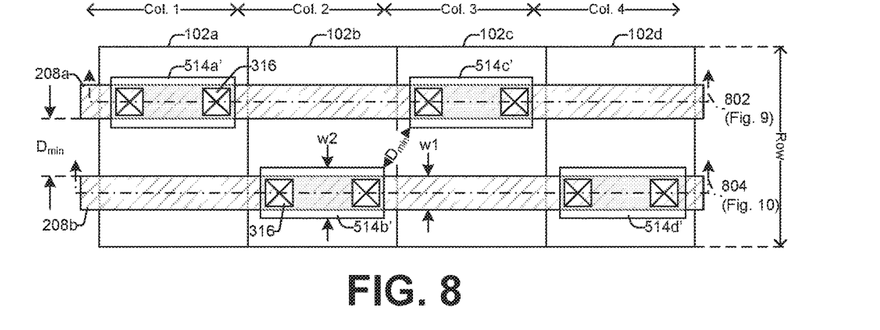
FIG. 8 illustrates another layout view of a row of memory cells in accordance with some embodiments.

FIG. 8 shows another possible layout consistent with FIG. 5's schematic. In FIG. 8, first and second conductive lines 208a, 208b extend over a row of memory cells, and a number of conductive line segments 314 are electrically coupled in parallel with the first and second conductive lines 208a, 208b. A first subset of conductive line segments 514a', 514c' are co-linear along a first axis 802 directly over the first conductive line 208a, and the second subset of conductive line segments 514b', 514d' are co-linear along a second axis 804. The second axis 804 is arranged directly over the second conductive line 208b and is spaced apart from the first axis 802. Other layouts are also possible.

Figure 9:
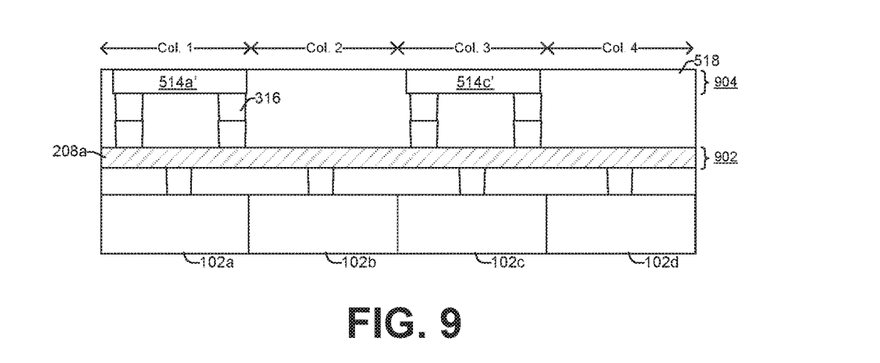
FIGS. 9-10 illustrate some embodiments of cross-sectional views of the row of memory cells in accordance with FIG. 8.
Figure 10:
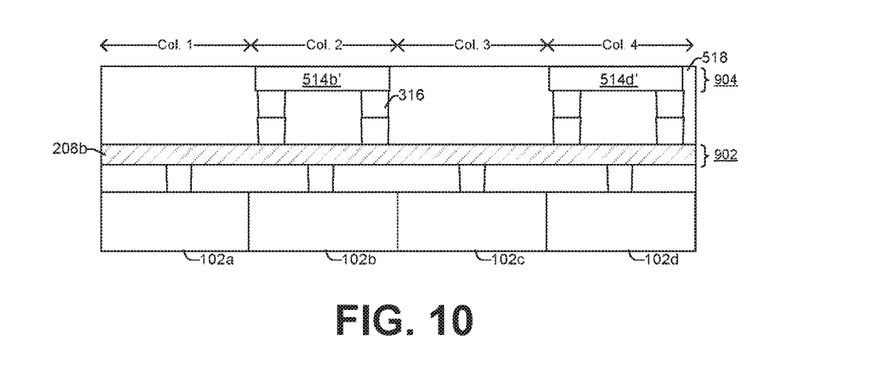

FIGS. 9-10 show some embodiments of cross-sectional views of FIG. 8's layout, along first axis 802 and second axis 804. As shown in FIGS. 8-10, the first and second conductive lines 208a, 208b are formed in a first interconnect layer 902, and the conductive line segments 514a, 514b are formed in a second interconnect layer 904 that resides over the first interconnect layer 902. The first and second conductive lines 208a, 208b and conductive line segments 514a, 514b are surrounded by a dielectric structure 518, such as made of low-k dielectric material or silicon dioxide, for example. Vias 316 extend through the dielectric structure 518 to couple the first conductive line 208a in parallel with the conductive line segments 514a', 514c'; and to couple the second conductive line 208b in parallel with the conductive line segments 514b', 514d'. In some embodiments, the first interconnect layer 902 is a metal2 layer immediately over a lowermost metal1 layer (not shown), and the second interconnect layer 904 is a metal4 layer with an intervening metal3 layer (not shown) arranged between the metal2 layer and metal 4 layer.

FIGS. 11-14 provide several different example memory architectures making use of first and second conductive lines which have conductive line segments arranged generally in parallel over the first and second conductive lines. In the examples of FIGS. 11-14, the first and second conductive lines correspond to wordlines of these various memory architectures, however, it will be appreciated in that other embodiments, the first and second conductive lines can correspond to bitlines or other pairs of conductive lines that extend generally in parallel with one another over a row or column of cells. Thus, FIGS. 11-14 should not be construed as limiting, but are merely examples of a few ways in which the disclosure can manifest itself.

Figure 11:
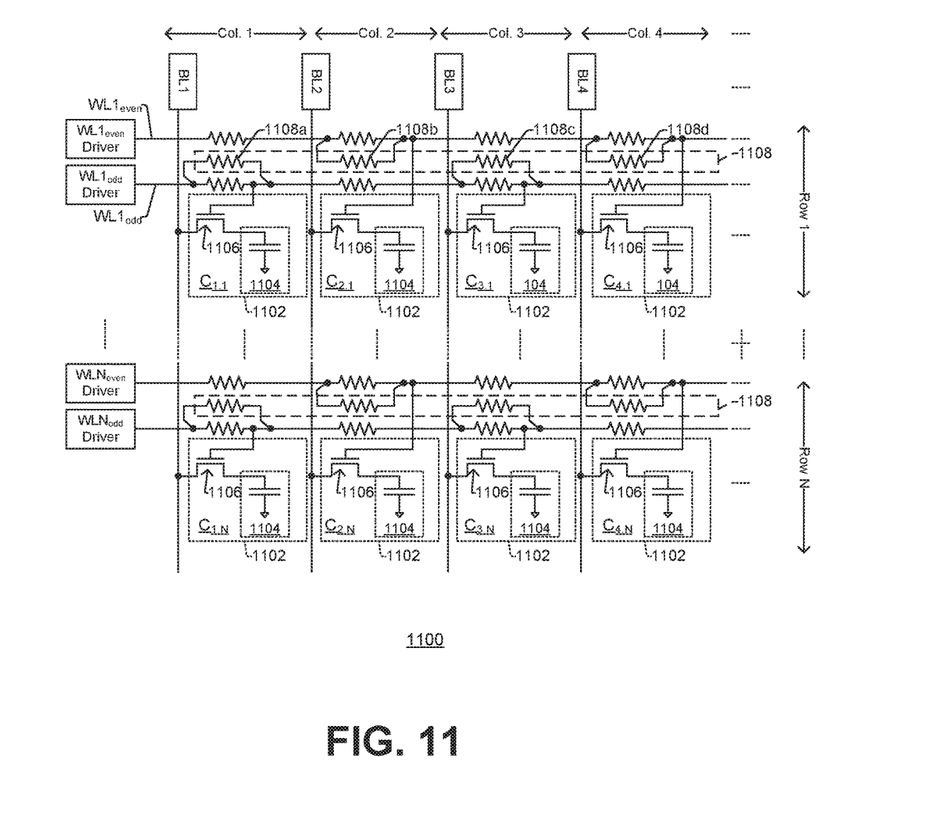
FIG. 11 illustrates a schematic diagram of some embodiments of a memory device that includes single-ended, single port memory cells having first and second interleaved wordlines extending generally in parallel over each row in accordance with some embodiments.

FIG. 11 illustrates a block diagram of a memory device 1100 that makes use of so-called "interleaved" wordlines in accordance with some embodiments. In memory device 1100 the interleaved wordlines are coupled to single-ended, single port memory cells 1102, each of which includes an access transistor 1106 and a single-ended data storage element 1104, such as a trench capacitor or metal-insulator-metal (MIM) capacitor for example.

Along each row, a pair of interleaved wordlines are coupled to even and odd columns of memory cells of the row in alternating fashion. For example, in Row 1, a pair of interleaved wordlines $WL1_{odd}$, $WL1_{even}$ are coupled to gate electrodes of access transistors 1106 for cells $C_{1,1}$-$C_{4,1}$. Thus, $WL1_{odd}$ can be coupled to gate electrodes of access transistors 1106 for memory cells of odd columns of Row 1 (e.g., memory cell $C_{1,1}$ of column 1; memory cell $C_{3,1}$ of column 3; . . . ), while $WL1_{even}$ can be coupled to gate electrodes of access transistors 1106 for memory cells of even columns of Row 1 (e.g., memory cell $C_{2,1}$ of column 2; memory cell $C_{4,1}$ of column 4; . . . ). A single bitline extends along each column, and is coupled to source/drain regions of access transistors 1106 along the column. Conductive line segments 1108 are coupled in parallel with the interleaved wordlines. A first subset of conductive line segments are coupled to odd memory cells along each row, and a second subset of conductive line segments are coupled to even memory cells along that row. For example, along row 1, conductive line segments 1108a, 1108c are coupled to $WL1_{odd}$, and conductive line segments 1108b, 1108d are coupled to $WL1_{even}$. The conductive line segments along each row can manifest themselves as previously illustrated in FIG. 2-FIG. 9, for example. Compared to traditional architectures where each wordline corresponds to a single row in a one-to-one manner, the interleaved wordlines of FIG. 11 can reduce signal propagation delay on the wordlines and can reduce the power needed for the bitlines. The conductive line segments 1108 being arranged in parallel with the interleaved wordlines can further reduce the signal propagation delay and signal degradation, thereby improving performance.

Figure 12:
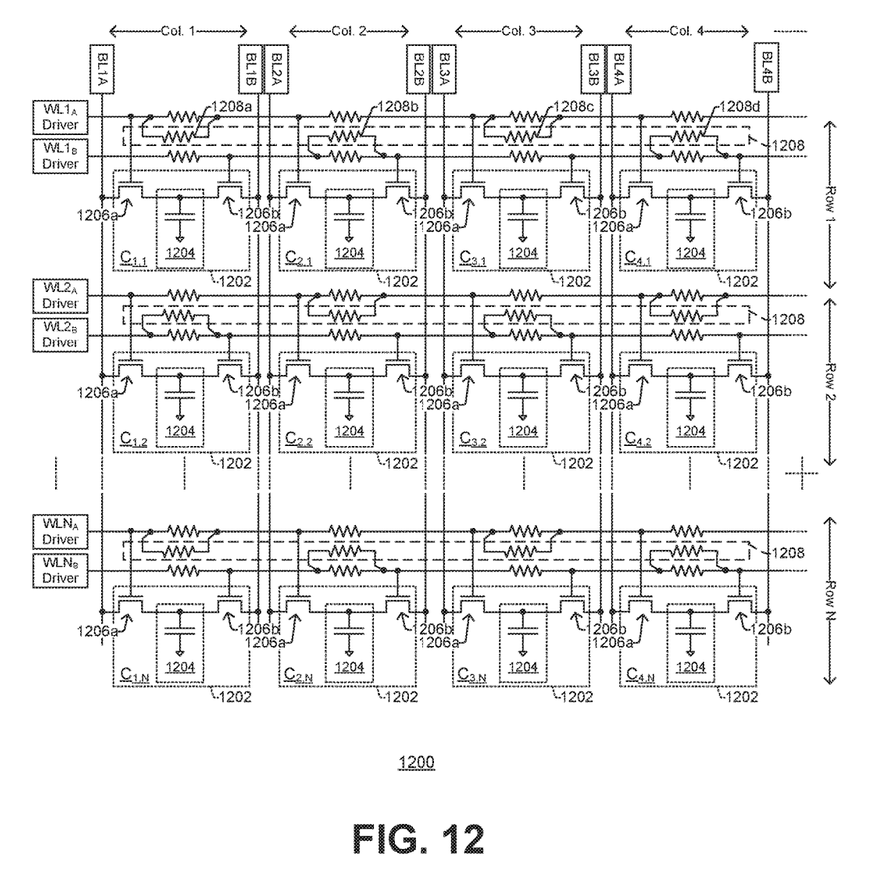
FIG. 12 illustrates a schematic diagram of some embodiments of a memory device that includes single-ended, dual port memory cells having first and second wordlines extending generally in parallel over each row in accordance with some embodiments.

Whereas FIG. 11 illustrated a memory device 1100 made up of single-ended, single-port memory cells 1102, FIG. 12 shows a memory device 1200 made up of single-ended, dual port memory cells 1202. Each memory cell 1202 includes a dual port, single-ended data storage element 1204, such as a capacitor. Each memory cell 1202 also includes a pair of access transistors 1206a, 1206b.

In the memory device 1200, read and write operations can be made through two "ports", which are indicated by subscripts "A" and "B" in FIG. 12. Each port has its own set of wordlines and its own set of bitlines, which are separate from those of the other port. For example, along the rows of the array, port A includes wordlines WL1A, WL2A, . . . , WLNA, while port B includes wordlines WL1B, WL2B, . . . , WLNB. Along the columns of the array, port A includes bitlines $BL_{1A}$, $BL_{2A}$, . . . ; while port B includes bitlines $BL_{1B}$, $BL_{2B}$, . . . A number of conductive line segments 1208 are coupled in parallel with the wordlines for each row.

Each memory cell 1202 resides at an intersection of a row and column and can be accessed through the two ports. Moreover, because of the two port design, data can be read to or written to two different rows of the array at the same time. For example, a first row of memory cells (e.g., cells $C_{1,1}$ through $C_{4,1}$ of Row 1) can be accessed through a port A wordline (e.g., through WL1A), and the bitlines of port A can be used to read and/or write values to the accessed row. At the same time, a second row of memory cells (e.g., cells $C_{1,2}$ through $C_{4,2}$ of Row 2) can be concurrently accessed through port B wordline (e.g., through WL2B), and the bitlines of port B can be used to read from or write to the second row of accessed memory cells. A first subset of the plurality of conductive line segments 1208 (e.g., 1208a, 1208c) are coupled to the wordline corresponding to the first port of each memory cell along the row (e.g., WL1A), and a second subset of the plurality of conductive line segments 1208 (e.g., 1208b, 1208d) are coupled to the second port of each memory cell along the row (e.g., WL1B). The conductive lines segments 1208 reduce the resistance of the wordlines for port A and port B, thereby reducing signal degradation.

Figure 13:
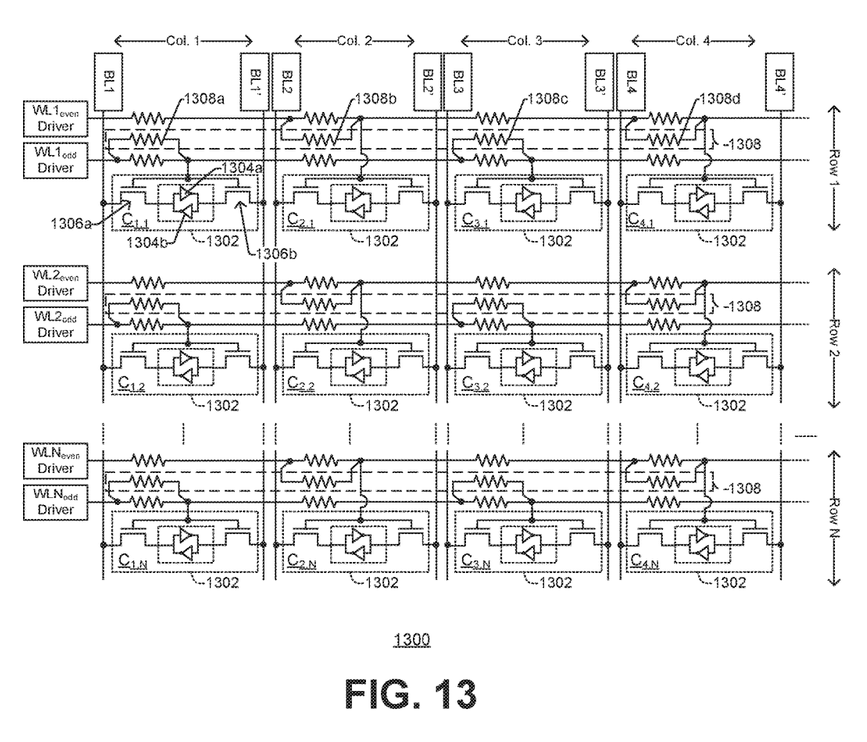
FIG. 13 illustrates a schematic diagram of some embodiments of a memory device that includes differential, single port memory cells having first and second interleaved wordlines extending generally in parallel over each row in accordance with some embodiments.

FIG. 13 illustrates another block diagram of a memory device 1300, such as an SRAM device, that makes use of interleaved wordlines which extend over rows of differential, single-port memory cells 1302. Each memory cell includes a pair of cross-coupled inverters (e.g., 1304a, 1304b), which establish complementary data storage nodes, and a pair of access transistors (e.g., 1306a, 1306b).

Along each row, a pair of interleaved wordlines are coupled to even and odd columns of memory cells of the row in alternating fashion. For example, in Row 1, a pair of interleaved wordlines $WL1_{odd}$, $WL1_{even}$ are coupled to cells $C_{1,1}$-$C_{4,1}$. Thus, $WL1_{odd}$ can be coupled to memory cells of odd columns of Row 1 (e.g., memory cell $C_{1,1}$ of column 1 and memory cell $C_{3,1}$ of column 3), while $WL1_{even}$ can be coupled to memory cells of even columns of Row 1 (e.g., memory cell $C_{2,1}$ of column 2 and memory cell $C_{4,1}$ of column 4).

Along each column, a pair of complementary bitlines extend over the column and are coupled to source/drain regions of access transistors along the column. The bitlines are complementary in that if one bitline of a pair of complementary bitlines carries a logical "1" value, the other bitline of the pair generally carries a logical "0", or vice versa.

A number of conductive line segments 1308 extend over the pair of interleaved wordlines for each row. The conductive line segments 1308 are coupled to be electrically in parallel with the wordlines of the row. For example, along Row 1, a first subset of conductive line segments (e.g., 1308a, 1308c) are coupled to odd memory cells along the row, and a second subset of conductive line segments (e.g., 1308b, 1308d) are coupled to even memory cells along the row.

Compared to traditional architectures where each wordline corresponds to a single row in a one-to-one manner, the interleaved wordlines of FIG. 13 can reduce signal propagation delay on the wordlines and can reduce the power needed for the bitlines. The conductive line segments 1308 being coupled in parallel with the interleaved wordlines can further reduce the signal propagation delay and signal degradation, thereby improving performance.

Figure 14:
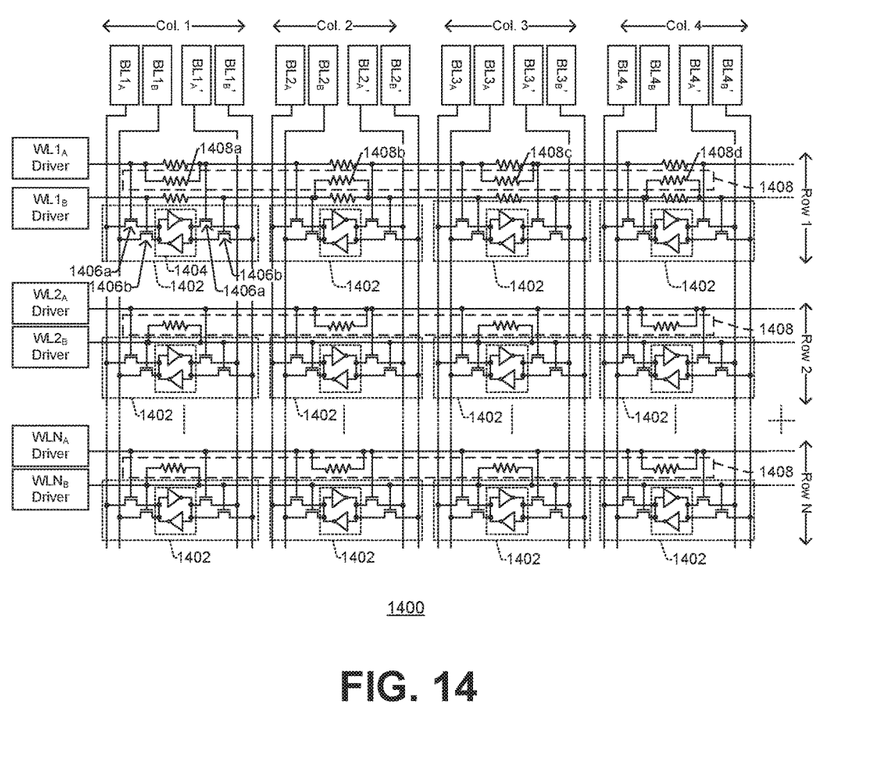
FIG. 14 illustrates a schematic diagram of some embodiments of a memory device including differential, dual port memory cells having first and second wordlines extending generally in parallel over each row in accordance with some embodiments.

FIG. 14 shows another embodiment of a memory device 1400 made up of differential, dual port memory cells 1402. Each memory cell includes a pair of cross-coupled inverters (e.g., 1404), which establish complementary data storage nodes, and two pairs of access transistors. The first pair of access transistors (1406a) allows access to the complementary data storage nodes through a first ("A") port, while the second pair of access transistors (1406b) allows access to the complementary data storage nodes through a second ("B") port.

The "A" and "B" ports each has its own set of wordlines and its own set of bitlines, which are separate from those of the other port. For example, along the rows of the array, port A includes wordlines WL1A, WL2A, . . . , WLNA, while port B includes wordlines WL1B, WL2B, . . . , WLNB. Along the columns of the array, port A includes complementary bitline pairs $BL_{1A}/BL_{1A'}$, $BL_{2A}/BL_{2A'}$, . . . ; while port B includes bitline pairs $BL_{1B}/BL_{1B'}$, $BL_{2B}/BL_{2B'}$ . . . Conductive line segments 1408 extend over the rows of cells, and are electrically coupled in parallel with the wordlines of the row. For example, along Row 1, a first subset of conductive line segments (e.g., 1408a, 1408c) are coupled to odd memory cells along Row1, and a second subset of conductive line segments (e.g., 1408b, 1408d) are coupled to even memory cells along Row1. The conductive line segments 1408 being coupled in parallel with the dual-port wordlines can further reduce the signal propagation delay and signal degradation, thereby improving performance.

Figure 15:
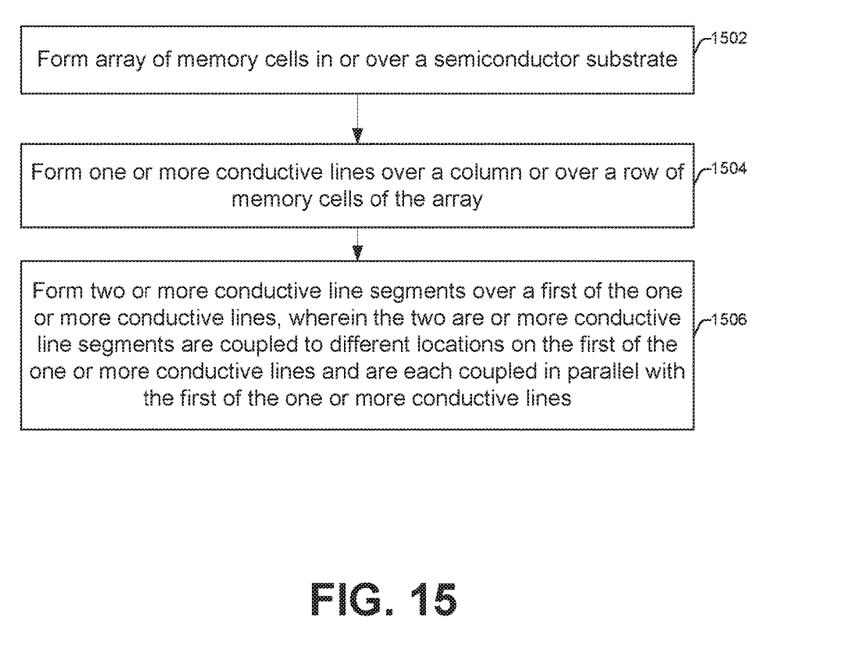
FIG. 15 illustrates a method in flowchart format in accordance with some embodiments.

FIG. 15 illustrates a flowchart in accordance with some embodiments. While the disclosed methods (e.g., method 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, an array of memory cells are formed in or over a semiconductor substrate. For example, 1502 can correspond to forming an array 101 of memory cells 102 as shown in FIG. 1.

At 1504, one or more conductive lines are formed over a column or over a row of memory cells of the array. For example, 1504 can correspond to forming a plurality of wordlines 108 which extend over the array, as shown in FIG. 1. Alternatively, 1504 can correspond to forming a plurality of bitlines which extend over the array, or forming a plurality of other lines over the array.

At 1506, two or more conductive line segments are formed over a first of the one or more conductive lines. The two or more conductive line segments are coupled to different locations on the first of the one or more conductive lines, and each are coupled in parallel with the first of the one or more conductive lines. For example, 1506 can correspond to forming two or more conductive segments 114 as shown in FIG. 1.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first column" described in connection with a first figure may (or may not) correspond to a "first column" described in connection with a second figure (e.g., or may even correspond to a "second column" in the second figure), and may (or may not) correspond to a "first column" in an un-illustrated embodiment. Further, because a left-most cell in a row can be thought of as the zeroth cell or the first cell of the row, the terms "even" and "odd" can be transposed depending on the arbitrary convention assigned to the first cell of the row.

Thus, some embodiments of the present disclosure relate to a memory device. The memory device includes first and second conductive lines extending generally in parallel with one another over a row of memory cells. The first and second conductive lines are disposed in a first interconnect layer and are coupled to memory cells of the row. A first plurality of conductive line segments are disposed in a second interconnect layer disposed over the first interconnect layer. Conductive line segments of the first plurality of conductive line segments are coupled to different locations on the first conductive line and are coupled in parallel with the first conductive line. A second plurality of conductive line segments are disposed over the second conductive line. Conductive line segments of the second plurality of conductive line segments are coupled to different locations on the second conductive line and are coupled in parallel with the second conductive line.

In other embodiments, the present disclosure relates to a memory device including a plurality of memory cells arranged in rows and columns. A memory cell includes a data storage element and one or more access transistors. First and second conductive lines extend generally in parallel with one another over a row of cells and are coupled to gates of access transistors along the row. A first plurality of conductive line segments is disposed over the first conductive line. Conductive line segments of the first plurality of conductive line segments are coupled to different locations on the first conductive line and are each coupled in parallel with the first conductive line. A second plurality of conductive line segments is disposed over the second conductive line. Conductive line segments of the second plurality of conductive line segments are each coupled to different locations on the second conductive line and are coupled in parallel with the second conductive line.

In still other embodiments, the present disclosure relates to a static random access memory device. A plurality of memory cells is arranged in rows and columns. A first memory cell in a row has an outer perimeter that directly contacts an outer perimeter of a second memory cell of the row. A first wordline extends over the row of memory cells so as to pass between upper and lower edges of the outer perimeters of the first and second memory cells. The first wordline is electrically coupled to at least one of the first and second memory cells. A second wordline extends over the row of memory cells so as to pass between the upper and lower edges of the outer perimeters of the first and second memory cells. The second wordline extends generally in parallel with the first wordline and is electrically coupled to at least one of the first and second memory cells. A first plurality of conductive line segments is arranged over the first wordline, and is coupled to different locations on the first wordline. The first plurality of conductive line segments is coupled in parallel with the first wordline. A second plurality of conductive line segments is disposed over the second conductive line. Conductive line segments of the second plurality of conductive line segments are coupled to different locations on the second wordline. The second plurality of conductive line segments is coupled in parallel with the second wordline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate including a plurality of memory cells arranged in or over the substrate, the plurality of memory cells being arranged in rows and columns;
first and second conductive lines over the substrate and extending generally in parallel with one another over a row or column of memory cells, the first and second conductive lines being disposed in a first interconnect layer and being coupled to memory cells of the row or column, wherein the memory cells of the row or column are arranged so an axis in a first direction passes over the memory cells of the row or column and the first and second conductive lines are spaced apart from each other in a second direction perpendicular to the first direction;
a first plurality of conductive line segments being disposed in a second interconnect layer disposed over the first interconnect layer, wherein conductive line segments of the first plurality of conductive line segments are coupled to different locations on the first conductive line and are coupled in parallel with the first conductive line; and
a second plurality of conductive line segments disposed over the second conductive line, wherein conductive line segments of the second plurality of conductive line segments are coupled to different locations on the second conductive line and are coupled in parallel with the second conductive line.

2. The memory device of claim 1, wherein the first plurality of conductive line segments are co-linear along a centerline between the first and second conductive lines, and the second plurality of conductive line segments are also co-linear along the centerline between the first and second conductive lines, as viewed from over the row or column of memory cells.

3. The memory device of claim 1, wherein the first plurality of conductive line segments are co-linear along a first axis directly over the first conductive line, and the second plurality of conductive line segments are co-linear along a second axis directly over the second conductive line and spaced apart from the first axis.

4. The memory device of claim 1, wherein the first plurality of conductive line segments are coupled to a first subset of memory cells along the row or column through the first conductive line, and wherein the second plurality of conductive line segments are coupled to a second subset of memory cells along the row or column through the second conductive line, the first and second subsets of memory cells being mutually exclusive.

5. The memory device of claim 4, wherein the first subset of the plurality of conductive line segments are coupled to odd memory cells along the row or column, and wherein the second subset of the plurality of conductive line segments are coupled to even memory cells along the row or column.

6. The memory device of claim 1, wherein there is a one-to-one correspondence between a number of memory cells in the row or column and a sum of the first plurality of conductive line segments plus the second plurality of conductive line segments.

7. The memory device of claim 1, wherein the first and second conductive lines each have a first minimum line width, and a conductive line segment of the plurality of conductive line segments has a second minimum line width that is greater than the first minimum line width.

8. The memory device of claim 4, wherein the first subset of the plurality of conductive lines are spaced at regular intervals over a length of the first conductive line.

9. The memory device of claim 1, wherein the first and second interconnect layers are included in an interconnect structure that is made up of multiple metal layers which are stacked over one another and separated from one another by a dielectric structure, wherein the first interconnect layer is a metal2 layer immediately over a lowermost metal1 layer in the interconnect structure, and the second interconnect layer is a metal4 layer with an intervening metal3 layer arranged between the metal2 layer and metal 4 layer.

10. The memory device of claim 4, wherein the memory cells are arranged along a row and are each accessible through first and second ports, wherein the first subset of the plurality of conductive line segments are coupled to the first port of each memory cell along the row, and wherein the second subset of the plurality of conductive line segments are coupled to the second port of each memory cell along the row.

11. The memory device of claim 1, wherein the first conductive line corresponds to a first wordline that is coupled to a gate electrode of a first access transistor of a first memory cell, and the second conductive line corresponds to a second wordline that is coupled to a gate electrode of a second access transistor of a second memory cell.

12. The memory device of claim 1, wherein the memory cells are arranged along a column and the first conductive line corresponds to a first bitline that is coupled to a source/drain region of a first access transistor of a first memory cell of the row, and the second conductive line corresponds to a second bitline that is coupled to a source/drain region of a second access transistor of a second memory cell of the row.

13. A memory device, comprising:
a substrate;
a plurality of memory cells arranged in or over the substrate and being arranged in rows and columns, a memory cell including a data storage element and one or more access transistors;
first and second conductive lines extending over the substrate and generally in parallel with one another over a row of cells and being coupled to gates of access transistors along the row, wherein the memory cells of the row are arranged so an axis in a first direction passes over the memory cells of the row and the first and second conductive lines are spaced apart from each other in a second direction perpendicular to the first direction;
a first plurality of conductive line segments disposed over the first conductive line, wherein conductive line segments of the first plurality of conductive line segments are coupled to different locations on the first conductive line and are each coupled electrically in parallel with the first conductive line; and
a second plurality of conductive line segments disposed over the second conductive line, wherein conductive line segments of the second plurality of conductive line segments are each coupled to different locations on the second conductive line and are coupled electrically in parallel with the second conductive line.

14. The memory device of claim 13, wherein the first plurality of conductive line segments are co-linear along a centerline between the first and second conductive lines, and the second plurality of conductive line segments are also co-linear along the centerline between the first and second conductive lines, as viewed from over the memory cells.

15. The memory device of claim 14, further comprising:
two or more vias that that electrically couple a first conductive line segment of the first plurality of conductive line segments to two or more different locations, respectively, on the first conductive line.

16. The memory device of claim 13, wherein the first plurality of conductive line segments are coupled to a first subset of memory cells along the row through the first conductive line, and wherein the second plurality of conductive line segments are coupled to a second subset of memory cells along the row through the second conductive line, the first and second subsets of memory cells being mutually exclusive.

17. A memory device, comprising:
a substrate;
a plurality of memory cells arranged in or over the substrate and being arranged in rows and columns, wherein a first memory cell in a row has an outer perimeter that directly contacts an outer perimeter of a second memory cell of the row;
a first wordline extending in a first direction over the substrate and over the row of memory cells so as to pass between upper and lower edges of the outer perimeters of the first and second memory cells, the first wordline being electrically coupled to at least one of the first and second memory cells;
a second wordline extending in the first direction over the row of memory cells and isolated from the first wordline so as to pass between the upper and lower edges of the outer perimeters of the first and second memory cells and extending generally in parallel with the first wordline, the second wordline being electrically coupled to at least one of the first and second memory cells, wherein the first and second wordlines are spaced apart from each other in a second direction perpendicular to the first direction;
a first plurality of conductive line segments arranged over the first wordline and being coupled to different locations on the first wordline, the first plurality of conductive line segments being coupled in electrically parallel with the first wordline; and
a second plurality of conductive line segments disposed over the second wordline, wherein conductive line segments of the second plurality of conductive line segments are coupled to different locations on the second wordline, the second plurality of conductive line segments being coupled electrically in parallel with the second wordline.

18. The memory device of claim 17, wherein a centerline extends equidistantly between the first and second wordlines, and the first and second pluralities of conductive line segments are co-linear along the centerline, as viewed from over the row.

19. The memory device of claim 18, further comprising:
two or more first vias that that electrically couple a first conductive line segment of the first plurality of conductive line segments to two or more different locations, respectively, on the first wordline; and
two or more second vias that that electrically couple a first conductive line segment of the second plurality of conductive line segments to two or more different locations, respectively, on the second wordline.

20. The memory device of claim 18, wherein the memory cells are dual-port memory cells, or wherein the first wordline is coupled to odd columns of memory cells of the memory device and the second wordline is coupled to even columns of memory cells of the memory device.

* * * * *